(12) United States Patent
Kawasaki

(10) Patent No.: US 8,116,121 B2
(45) Date of Patent: Feb. 14, 2012

(54) SEMICONDUCTOR DEVICE AND MANUFACTURING METHODS WITH USING NON-PLANAR TYPE OF TRANSISTORS

(75) Inventor: Hirohisa Kawasaki, Yorktown Heights, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 112 days.

(21) Appl. No.: 12/399,197

(22) Filed: Mar. 6, 2009

(65) Prior Publication Data

US 2010/0224943 A1 Sep. 9, 2010

(51) Int. Cl.
*H01L 21/336* (2006.01)
(52) U.S. Cl. .......................... 365/156; 438/197; 438/199
(58) Field of Classification Search .................... None
See application file for complete search history.

(56) References Cited

U.S. PATENT DOCUMENTS

| | | | |
|---|---|---|---|
| 6,970,373 B2 | 11/2005 | Datta et al. | |
| 2007/0170474 A1 | 7/2007 | Kawasaki | |
| 2009/0001426 A1* | 1/2009 | Cheng et al. | 257/213 |
| 2009/0108353 A1* | 4/2009 | Cho | 257/347 |
| 2009/0166680 A1* | 7/2009 | Pillarisetty et al. | 257/204 |

FOREIGN PATENT DOCUMENTS

JP   2007-201021   8/2007

* cited by examiner

*Primary Examiner* — N Drew Richards
*Assistant Examiner* — Peter Bradford
(74) *Attorney, Agent, or Firm* — Turocy & Watson, LLP

(57) ABSTRACT

Static random access memory cells and methods of making static random access memory cells are provided. The static random access memory cells contain two non-planar pass-gate transistors, two non-planar pull-up transistors, two non-planar pull-down transistors. A portion of a fin of the non-planar pull-up transistor is electrically connected to a portion of a fin of the non-planar pull-down transistor by an assist-bar. The methods involve forming an assist-fin between fins of a non-planar pull-up transistor and a non-planar pull-down transistor and between gate electrodes, and widening a width of the assist-fin to form the assist-bar so that a portion of the fin of non-planar pull-up transistor is electrically connected to a portion of the fin of non-planar pull-down transistor via the assist-bar.

9 Claims, 11 Drawing Sheets

SEMICONDUCTOR DEVICE AND MANUFACTURING METHODS WITH USING NON-PLANAR TYPE OF TRANSISTORS

TECHNICAL FIELD

The following description relates generally to static random access memory cells and methods of making static random access memory cells.

BACKGROUND

As transistor design is improved and evolved, the number of different types of transistors continues to increase. Multi-gate non-planar metal oxide semiconductor field effect transistors (MOSFETs), including double-gate non-planar MOSFETs (e.g., finMOSFETs) and tri-gate non-planar MOSFETs, are developed to provide scaled devices with faster drive currents and reduced short channel effects over planar MOSFETs.

Double-gate non-planar MOSFETs are FETs in which a channel region is formed in a thin semiconductor fin. The source and drain regions are funned in the opposing ends of the fin on either side of the channel region. Gates are formed on each side of the thin semiconductor fin, and in some cases, on the top or bottom of the fin as well, in an area corresponding to the channel region. FinMOSFETs are a type of double-gate non-planar FETs in which the fin is so thin as to be fully depleted.

Tri-gate non-planar MOSFETs have a similar structure to that of double-gate non-planar MOSFETs; however, the fin width and height are approximately the same so that gates can be formed on three sides of the channel, including the top surface and the opposing sidewalls. The height to width ratio is generally in the range of 3:2 to 2:3 so that the channel will remain fully depleted and the three-dimensional field effects of a tri-gate MOSFET will give greater drive current and improved short-channel characteristics over a planar transistor.

Static random access memory (SRAM) cells can employ such multi-gate non-planar MOSFETs. For example, 6T-SRAM cells have two multi-gate non-planar pass-gate transistors, two multi-gate non-planar pull-up transistors, and two multi-gate non-planar pull-down transistors.

SUMMARY

The following presents a simplified summary of the information disclosed in the specification in order to provide a basic understanding of some aspects of the disclosed information. This summary is not an extensive overview of the disclosed information, and is intended to neither identify key or critical elements of the disclosed information nor delineate the scope of the disclosed information. Its sole purpose is to present some concepts of the disclosed information in a simplified form as a prelude to the more detailed description that is presented later.

One aspect of the innovation provides a static random access memory cell containing two non-planar pass-gate transistors, two non-planar pull-up transistors, two non-planar pull-down transistors, and two assist-bars. The assist-bar electrically connects a portion of the fin of the non-planar pull-up transistor and a portion of the fin of the non-planar pull-down. Because of the assist-bars, the random access memory cell does not need to have contact holes that are used to connect a portion of the fin of the non-planar pull-up transistor and a portion of the fin of the non-planar pull-down. Therefore, the cell size/area can be reduced.

Another aspect of the innovation relates to methods of making a static random access memory cell involving forming an assist-bar between a non-planar pull-up transistor and a non-planar pull-down transistor to facilitate electrically connecting a portion of the fin of the non-planar pull-up transistor and a portion of the fin of the non-planar pull-down transistor.

Yet another aspect of the innovation provides methods of decreasing a cell area of a static random access memory cell. The method involves electrically connecting a portion of a fin of a non-planar pull-up transistor and a portion of a fin of a non-planar pull-down transistor by an assist-bar.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the disclosed information when considered in conjunction with the drawings.

DETAILED DESCRIPTION

Figure 1A:
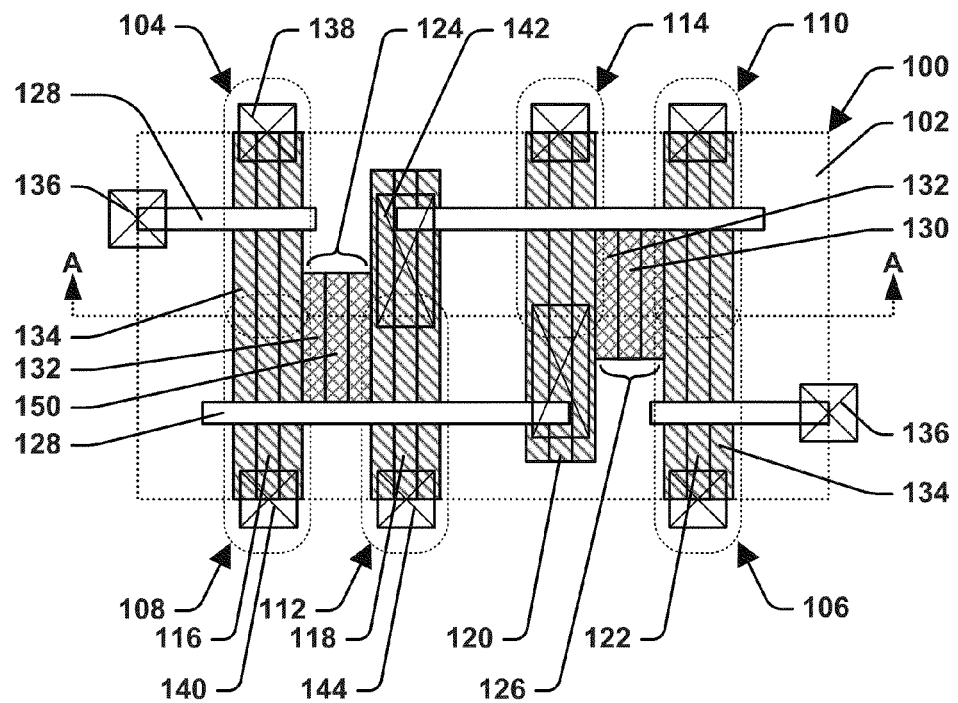
FIGS. 1a and 1b are a top view of exemplary static random access memory cells in accordance with an aspect of the subject innovation.

The subject innovation described herein provides semiconductor devices and manufacturing. In particular, the subject innovation provides static random access memory cells (e.g., 6T CMOS SRAM cells) containing non-planar transistors (e.g., double-gate transistor and tri-gate transistor). The static random access memory cells can contain non-planar transistors (e.g., double-gate transistor and tri-gate transistor). The static random access memory cell can contain two non-planar pass-gate transistors containing one or more fins; two non-planar pull-up transistors containing one or more fins; and two non-planar pull-down transistors containing one or more fins. The static random access memory cell can further contain two assist-bars that electrically connect a portion of fin of the non-planar pull-up transistor and a portion of fin of the non-planar pull-down transistor.

Conventional static random access memory cells generally contain twelve contact holes (e.g., one contact hole on respective two gate electrodes (gate contacts), three contact holes on respective two n-MOS fins, and two contact holes on respective two p-MOS fins). Two contact holes out of the twelve contact holes are located between pass-gate transistors and pull-down transistors, and the two contact holes are used to electrically connect portions of fins of pull-up transistors and portions of fins of pull-down transistors.

The subject static random access memory cell contains two assist-bars that electrically connect a portion of the fin of pull-up transistor and a portion of the fin of pull-down transistor instead of the two contact holes. That is, containing the assist-bar that electrically connect a portion of the fin of pull-up transistor and a portion of the fin of pull-down transistor, the subject static random access memory cells do not need to contain the two contact holes. While conventional static random access memory cell needs twelve contact holes, the subject static random access memory cell require only ten contact holes because of the assist-bars.

A cell area of static random access memory cell is generally defined by the placement and/or number of contact holes. The subject static random access memory cell can have a smaller cell area because it has less contact holes (ten contact holes) compared to conventional static random access memory cells. The cell area of the subject static random access memory cell can be reduced by, for example, about 13% by employing the two assist-bars. Moreover, difficulties of lithography in forming the two contact holes and two metal lines are resolved in the subject static random access memory cell because those contact holes and metal lines are excluded.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

FIG. 1a illustrates a top view of an exemplary static random access memory cell 100. In this example, the static random access memory cell 100 employs a 6T CMOS SRAM cell layout. The static random access memory cell has a semiconductor substrate 102 and six transistors thereon 104, 106, 108, 110, 112, 114. Two pass-gate transistors (e.g., transfer transistors or access transistors) are located in regions 104, 106. Two pull-down transistors (e.g., driver transistors) are located in regions 108, 110. Two pull-up transistors (e.g., load transistors) are located in regions 112, 114. These transistors can be a non-planar transistor and contain one or more fins. When the transistors respectively contain one fin, the static random access memory cell contains four fins 116, 118, 120, 122 on the semiconductor substrate. When the pull-down transistors and the pass-gate transistors can be an n-type transistor, the pull-up transistors can be a p-type transistor.

These transistors 104, 106, 108, 110, 112, 114 can be a non-planar double gate transistor. The non-planar double-gate transistor contains at least one fin formed substantially vertically to the surface of the semiconductor substrate in a direction substantially parallel to the surface of the semiconductor substrate. In such a transistor, a current is induced to flow through side faces of the fin in the direction substantially parallel to the surface of the semiconductor substrate.

The transistors 104, 106, 108, 110, 112, 114 of the subject innovation can be a tri-gate type transistor. The tri-gate transistor generally contains a relatively wide fin formed substantially vertically to the surface of the semiconductor substrate in a direction substantially parallel to the surface of the semiconductor substrate. Channels are formed in three surfaces of side faces and an upper surface of the fin, and a current is induced to flow through the three surfaces.

While FIG. 1a illustrates a top view of an exemplary static random access memory cell 100 in accordance with an aspect of the subject innovation, the details of the structure and manufacture of the transistors are not critical to the subject innovation. The details of the structure and manufacture of the transistors can be found in, for example, commonly-assigned U.S. Patent Application Publication No. 2007/0170474, which is hereby incorporated by reference.

The static random access memory cell 100 contains two assist-bars 124, 126. The assist-bars 124, 126 are located between the fin of pull-down transistor 108, 110 and the fin of pull-up transistor 112, 114. The assist-bars 124, 126 are designed such that the assist-bars 124, 126 do not intersect with gate electrodes 128 (e.g., the assist-bars 124, 126 are located between gate electrodes 128). The assist-bar is formed substantially vertically to the surface of the semiconductor substrate in a direction substantially parallel to the surface of the semiconductor substrate and parallel to the fins of pull-down transistor and pull-up transistor. The assist-bar facilitates electrically connecting a portion of the fin of the pull-down transistor and a portion of the fin of the pull-up transistor. The static random access memory cell 100 does not contain a contact hole and a conductive line that electrically connect the fin of the pull-down transistor and the fin of the pull-up transistor because of the assist-bar.

In one embodiment, the assist-bar 124, 126 connects a fin doped with an n-type dopant to a fin doped with a p-type dopant. When the pull-down transistor is an n-type transistor and the pull-up transistor is a p-type transistor, the assist-bar connects the N-typed FinMOSFET of the pull-down transistor to the P-typed FinMOSFET of the pull-up transistor. In particular, in one embodiment, the assist-bar facilitates electrically connecting diffusion layers of a pass-gate transistor, a pull-down transistor, and a pull-up transistor. In another embodiment, the assist-bar facilitates electrically connecting a diffusion layer of a pass-gate transistor, a drain of a pull-down transistor, and a drain of a pull-up transistor. As a result, one or more fins which are comprised in the pull-down transistors and the pass-gate transistors have only two types of contact holes; one contact hole that electrically connects a bitline to a n-diffusion layer and another contact hole that electrically connects the n-diffusion layer to a ground line. When the pull-down transistor is an n-type transistor, the N-typed FinMOSFET has only two types of contact holes; one contact hole that electrically connects a bitline to a n-diffusion layer and another contact hole that electrically connects a ground line to the n-diffusion layer. That is, the N-typed FinMOSFET does not have a contact hole that is used to connect the N-typed FinMOSFET to a storage node.

The assist-bar 124, 126 can be made by any suitable technique. In one embodiment, the assist-bars can be made by forming assist-fins 130, 150 between the fins of pull-up transistor and pull-down transistor and widening a width 132 of the assist-fins to form the assist-bars so that a portion of the fins of pull-up transistor are electrically connected to a portion of the fins of pull-down transistor via the assist-bar. The assist-fins and the fins of transistors can be formed from a semiconductor layer. In one embodiment, widths of portions of the transistor fins are widened 134 at the same time when widening the width of the assist-fin. The assist-fin can be widened by any suitable technique, for example, silicon epitaxial technique, silicidation technique, combinations thereof, or the like. Exemplary processes for making the assist-bar are described in detail below.

The assist-bar 124, 126 can contain any suitable material as long as the material can facilitate electrically connecting a portion of the fin of pull-up transistor to a portion of the fin of pull-down transistor. In one embodiment, the assist-bar contains a semiconductor material and metal-semiconductor compounds (e.g., metal silicides).

Contact holes are located on the fins and contact plugs in the contact holes connect the fins to conductive layers or conductive lines (e.g., metal layers or metal lines). The subject static random access memory cell 100 contains ten contact holes, one contact hole 136 on respective two gate electrodes, two contact holes 138, 140 on the respective two N-typed FinMOSFETs 116, 122, and two contact holes 142, 144 on the respective two P-typed FinMOSFETs 118, 120. The N-typed FinMOSFET 116, 122 has only two types of contact holes 138, 140; one contact hole 138 that electrically connects a bitline to the n-diffusion layer and another contact hole 140 that electrically connects the n-diffusion layer to a ground line. In one embodiment, the N-typed FinMOSFET 116, 122 does not have three or more contact holes. For example, the N-typed FinMOSFET does not have additional contact holes such as one connecting a portion of a fin of a pull-down transistor and a portion of a fin of a pull-up transistor.

Figure 1B:
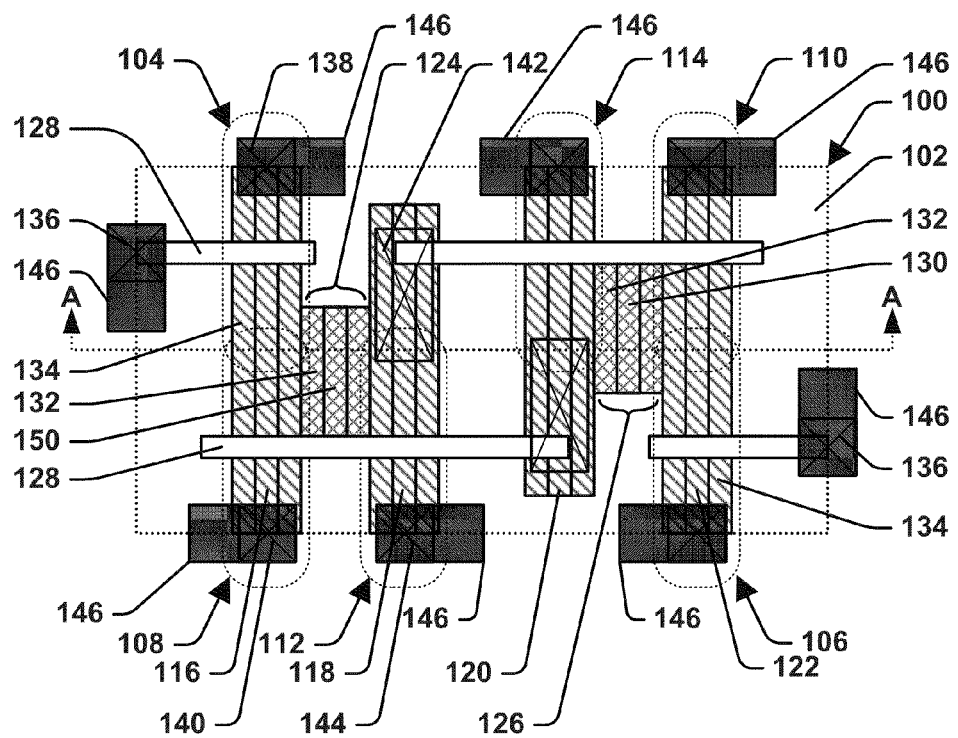

FIG. 1*b* illustrates a top view of another exemplary static random access memory cell 100. In this example, the static random access memory cell 100 employs a 6T CMOS SRAM cell layout. The static random access memory cell has a semiconductor substrate 102, six transistors thereon 104, 106, 108, 110, 112, 114, four fins 116, 118, 120, 122, two assist-bars 124, 126, and contact holes 136, 138, 140, 142, 144 in the same manner as described in connection with FIG. 1*a*. The static random access memory cell 100 can further contain conductive lines (e.g., metal layers or metal lines) 146. Conventional static random access memory cells typically contain ten conductive lines (one conductive line on respective two gate electrodes, two conductive lines on the respective two N-typed FinMOSFETs, one conductive line on respective two P-typed FinMOSFETs, and two conductive lines that connect a fin of pull-up transistor to a fin of pull-down transistor). In contrast, as shown in FIG. 1, the static random access memory cell 100 can contain only eight conductive lines 146; one conductive line on respective two gate electrodes 128, two conductive lines on the respective two N-typed FinMOSFETs 116, 122, and one conductive line on respective two P-typed FinMOSFETs 118, 120. The subject static random access memory cell 100 dose not contain a conductive line that electrically connects a portion of the fin of pull-up transistor to a portion of the fin of pull-down transistor because it contains the assist-bar 124, 126. While conventional static random access memory cells typically contain ten conductive lines, the subject static random access memory cell require only eight conductive lines because of the two assist-bars 124, 126.

Figure 2:
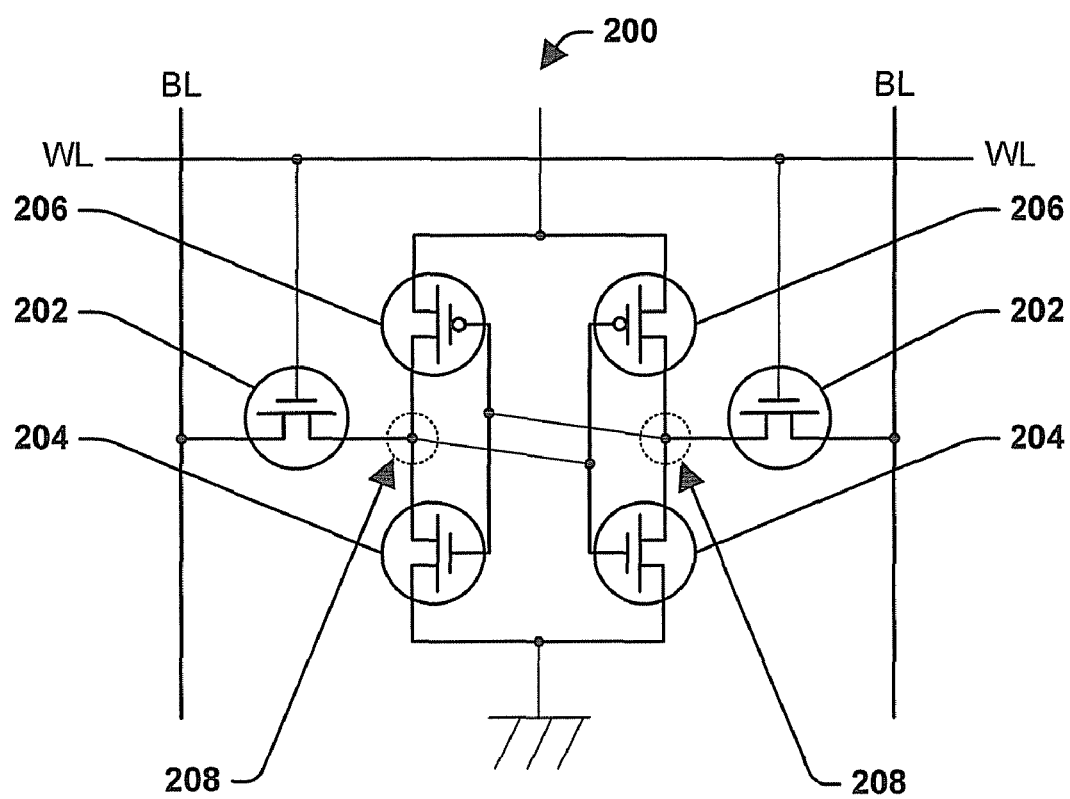
FIG. 2 is a circuit diagram of an exemplary static random access memory cell in accordance with an aspect of the subject innovation.

FIG. 2 illustrates a circuit diagram of an exemplary static random access memory cell 200. In this example, the static random access memory cell 200 employs a 6T CMOS SRAM cell layout. The static random access memory cell 200 contains two n-type pass-gate transistors 202, two n-type pull-down transistors 204, and two p-type pull-up transistors 206. These transistors can be a non-planar transistor and contain one or more fins, respectively.

The static random access memory cell 200 further contains two assist-bars 208. A portion of the fin of pull-up transistor 206 is electrically connected to a portion of the fin of pull-down transistor 204 by the assist-bar 208. In other words, the fin of the pull-up transistor is not electrically connected to the fin of the pull-down transistor by a contact hole and a conductive line. In one embodiment, diffusion layers of the pass-gate transistor 202, the pull-down transistor 204, and the pull-up transistor are electrically connected by the assist-bar 208. In another embodiment, a diffusion layer of the pass-gate transistor 202, a drain of the pull-down transistor 204, and a drain of the pull-up transistor are electrically connected by the assist-bar 208.

Figure 3:
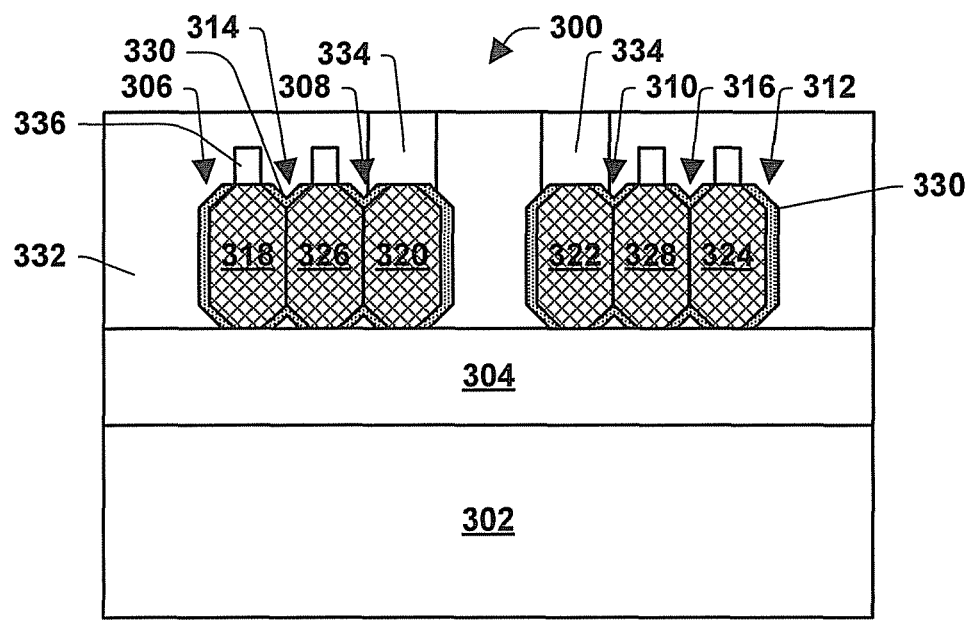
FIG. 3 is a cross-sectional illustration of exemplary static random access memory cell in accordance with an aspect of the subject innovation.

FIG. 3 illustrates a cross sectional view of an exemplary static random access memory cell 300 containing six transistors, such as that taken along line A-A of FIG. 1. The static random access memory cell 300 has a semiconductor substrate (e.g., silicon substrate) 302 and an insulating layer (e.g., a buried oxide (e.g., BOX) layer) 304 on the semiconductor substrate 302. The insulating layer 304 can contain any suitable insulating material such as silicon oxides and silicon nitrides. When the transistors contain one fin respectively, the static random access memory cell 300 contains four fins 306, 308, 310, 312 of the transistors on the semiconductor substrate 302. In one embodiment, the first fin is a first n-MOS fin 306, the second fin is a first p-MOS fin 308, the third fin is a second p-MOS fin 310, and the fourth fin is a second n-MOS fin 312. The first and fourth fins 306, 312 can be portions of pass-gate transistors and pull-down transistors. The second and third fins 308, 310 can be a portion of pull-up transistors.

The static random access memory cell 300 also contains two assist-bars 314, 316. The first assist-bar 314 electrically connects a portion of the first fin 306 to a portion of the second fin 308. The second assist-bar 316 electrically connects a portion of the third fin 310 to a portion of the fourth fin 312.

The transistor fins 306, 308, 310, 312 and the assist-bars 314, 316 can contain a semiconductor material 318, 320, 322, 324, 326, 328 and metal-semiconductor compounds 330 on the surface of the semiconductor material. The metal-semiconductor compounds facilitate electrically connecting the assist-bars 314, 316 to the transistor fins 306, 308, 310, 312. The semiconductor material 318, 320, 322, 324 of the transistor fins 306, 308, 310, 312 can directly contact with the semiconductor material 326, 328 of the assist-bars 314, 316, and the transistor fins 306, 308, 310, 312 are electrically connected with the assist-bars 314, 316 by the metal-semiconductor material compounds 330 that are located on the upper portions of the transistor fins and assist-bars. Although not shown, in one embodiment, the metal-semiconductor material compounds 330 exist at interfaces between the transistor fins and the assist-bars, and the transistor fins are electrically connected to the assist-bars by such metal-semiconductor material compounds.

The transistor fins 306, 308, 310, 312 and assist-bars 314, 316 can contain any suitable semiconductor material and any suitable metal-semiconductor compounds. Examples of semiconductor materials include silicon, germanium, gallium arsenide, indium phosphide, or the like. Examples of semiconductor compounds include meal silicides, metal germanides, metal germanosilicides, or the like. The fins and/or assist-bars contain the same or a different semiconductor material and/or metal-semiconductor compound. Although the fins and assist-bars can contain any suitable semiconductor material and metal-semiconductor compound, the innovation is hereinafter illustrated and described in the context of an exemplary fin and assist-bar containing silicon as a semiconductor material and metal silicides as metal-semiconductor compounds.

The static random access memory cell 300 further contains an insulation layer 332 over the fins and the assist-bars. The static random access memory cell 300 can contain one or more contact holes 334 on the fins, for example, on the second and third transistor fins. In this example, the static random access memory cell 300 contains cap layers 336 on the first and fourth transistor fins 306, 312 and on the two assist-bars 314, 316. In another embodiment, the static random access memory cell contains cap layers on some of the fins and assist-bars or the static random access memory cell does not contain any cap layers (not shown). The cap layer 336 typically contains oxides such as silicon oxide; nitrides such as silicon nitride, silicon rich nitride, and oxygen rich silicon nitride; and the like.

Figure 4:
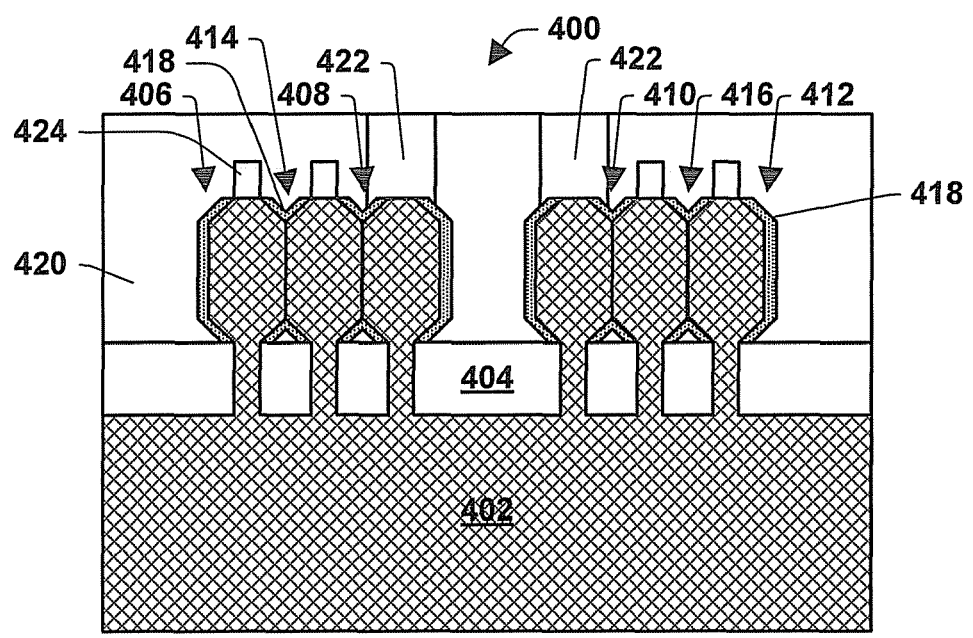
FIG. 4 is a cross-sectional illustration of another exemplary static random access memory cell in accordance with an aspect of the subject innovation.

FIG. 4 illustrates a cross sectional view of another exemplary static random access memory cell 400 containing six transistors, such as that taken along line A-A of FIG. 1. The static random access memory cell 400 has a semiconductor substrate (e.g., silicon substrate) 402 and an insulating layer (e.g., a shallow trench isolation (e.g., STI)) 404 on the semiconductor substrate. The static random access memory cell 400 contains four fins 406, 408, 410, 412 of the transistors and two assist-bars 414, 416 in the same manner as described in connection with FIG. 3 except that the semiconductor substrate 402, the transistor fins 406, 408, 410, 412, and assist-bars 414, 416 are formed from a bulk semiconductor substrate. As a result, the transistor fins 406, 408, 410, 412 and assist-bars 414, 416 contain the same semiconductor material as the substrate 402.

The transistor fins 406, 408, 410, 412 and assist-bars 414, 416 can contain metal-semiconductor compounds 418 on the surface of the semiconductor material. The static random access memory cell 400 can contain an insulation layer 420 over the fins and the assist-bars and one or more contact holes 422 on the fins, for example, on the second and third transistor fins. In this example, the static random access memory cell 400 contains cap layers 422 on the first and fourth transistor fins 406, 412 and on the two assist-bars 414, 416. Although not shown in FIG. 4, the static random access memory cell 400 contains cap layers on some of the fins and assist-bars or the static random access memory cell 400 does not contain any cap layers.

Figure 5:
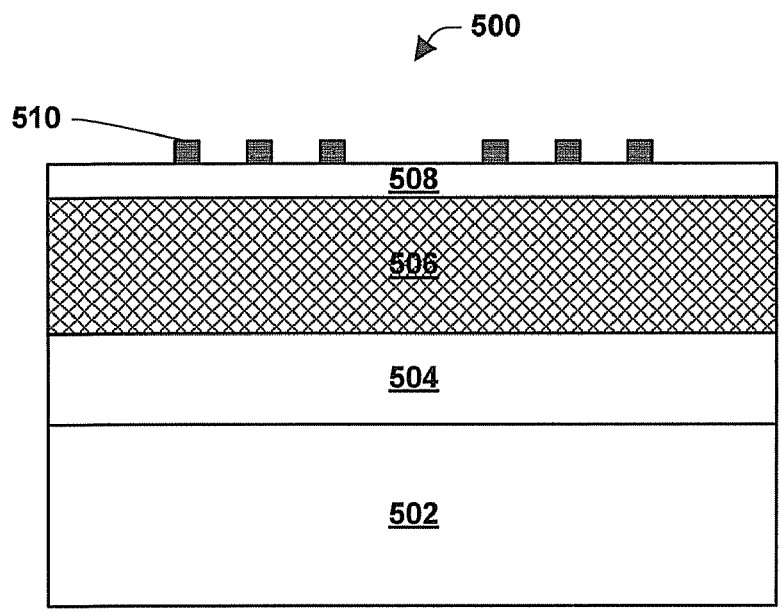
FIGS. 5-9 illustrate an exemplary methodology of forming a static random access memory cell in accordance with an aspect of the subject innovation.

Referring to FIGS. 5 to 10 and FIGS. 11 to 16, two of many possible exemplary embodiments of forming a static random access memory cell are specifically illustrated. FIG. 5 illustrates a cross sectional view of an intermediate state of an exemplary static random access memory cell 500. The static random access memory cell 500 can contain a substrate (e.g., silicon substrate) 502, a buried silicon oxide (e.g., BOX) layer 504, a silicon layer 506, a cap layer 508, and a patterned resist layer 510.

The patterned resist layer 510 can be formed by any suitable technique. For example, the patterned resist layer is formed by optical lithography, sidewall image transfer technique, or the like. Although not shown in FIG. 5, when the patterned resist layer is formed by the sidewall image transfer technique, the patterned resist can be in the shape of a triangle, trapezoid, or the like. The cap layer typically contains oxides such as silicon oxide; nitrides such as silicon nitride, silicon rich nitride, and oxygen rich silicon nitride; and the like.

Figure 6:
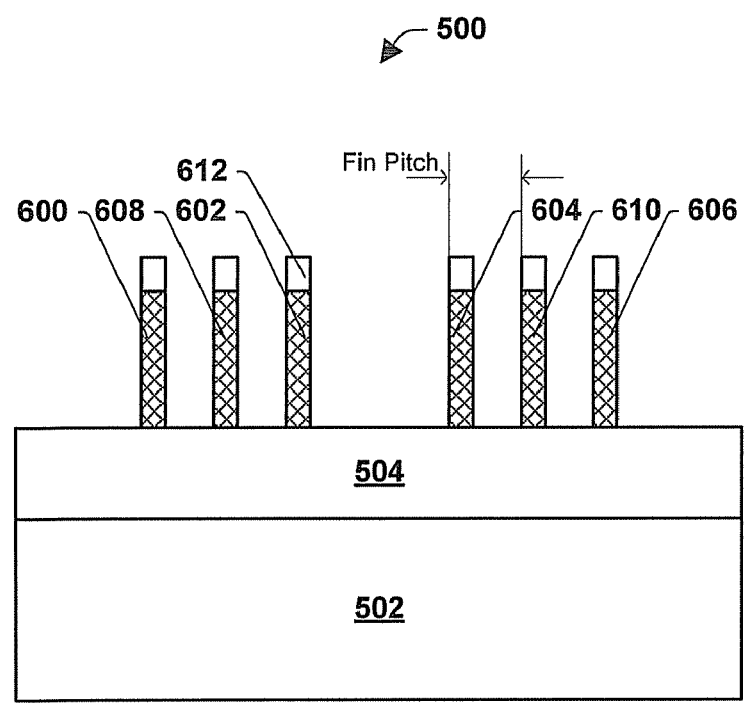

FIG. 6 illustrates forming six fins including four n- and p-MOS fins 600, 602, 604, 606 and two assist-fins 608, 610 from the silicon layer and forming six caps 612 on the fins from the cap layer. The first assist-fin 608 is located between the first n-MOS fin 600 and the first p-MOS fin 602. The second assist-fin 610 is located between the second p-MOS fin 604 and the second n-MOS fin 606. The first n-MOS fin 600 and second n-MOS fin 606 can be portions of pass-gate transistors and pull-down transistors. The first p-MOS fin 602 and second p-MOS fin 604 can be a portion of pull-up transistors. Although the four n- and p-MOS fins are shown in FIG. 6, the static random access memory cell 500 can contain any suitable number of fins depending on a type of the transistors contained in the static random access memory cell 500.

The caps 612 and fins 600, 602, 604, 606, 608, 610 can be formed by removing portions of the cap layer 508 and the silicon layer 506. The portions of the cap layer and the silicon layer can be removed by any suitable technique, for example, etching. For example, portions of the cap layer and the silicon layer are removed by contacting the cap layer and the silicon layer with any suitable etchant that does not substantially damage and/or remove other components of the static random access memory cell 500. Choice of a suitable process and reagents of etching depends on, for example, the cap layer material, the width and height of the fins, the desired implementations of the static random access memory cell structure 500 being fabricated, and the like.

Wet etching and/or dry etching containing isotropic etching and/or anisotropic etching can be employed. Examples of wet etchants for the silicon layer include tetraalkylammonium hydroxides (e.g., tetramethylammonium hydroxide (TMAH)) and alkali metal hydroxides (e.g., a potassium hydroxide (KOH) and cerium hydroxide (CeOH)). Examples of dry etching include reactive ion etching (RIB) using, for example, a mixture gas containing HBr (e.g., HBr and $O_2$ mixture gas, HBr/$NF_3$/He and $O_2$ mixture gas, $SF_6$, HBr and $O_2$ mixture gas). The mixture may further include $Cl_2$.

The fin 600, 602, 604, 606, 608, 610 has any suitable width that depends on the desired implementations of the static random access memory cell structure 500 being fabricated. The width may vary and is not critical to the subject innovation. All of the fins have the same width, or some of or all of the fins have a different width from each other. In one embodiment, the width of the fin is about 5 nm or more and about 30 nm or less. In another embodiment, the width of the fin is about 10 nm or more and about 20 nm or less. In yet another embodiment, the width of the fin is about 12 nm or more and about 18 nm or less. In still yet another embodiment, the width of the fin is about 15 nm.

A fin pitch of the fins 600, 602, 604, 606, 608, 610 can be any suitable length that depends on the desired implementations of the static random access memory cell structure 500 being fabricated. The fin pitch may vary and are not critical to the subject innovation. All of the fin pitches have the same length, or some of or all of the fin pitches have a different length from each other. In one embodiment, the fin pitch is about 15 nm or more and about 70 nm or less. In another embodiment, the fin pitch is about 25 nm or more and about 50 nm or less. In yet another embodiment, the fin pitch is about 30 nm or more and about 40 nm or less. In still yet another embodiment, the fin pitch is about 35 nm.

The fin 600, 602, 604, 606, 608, 610 has any suitable height that depends on the desired implementations of the static random access memory cell structure 500 being fabricated. The height may vary and are not critical to the subject innovation. All of the fins have the same height, or some of or all of the fins have a different height from each other. In one embodiment, the height of the fin is about 5 nm or more and about 80 nm or less. In another embodiment, the height of the fin is about 10 nm or more and about 70 nm or less. In yet another embodiment, the height of the fin is about 15 nm or more and about 60 nm or less.

The first n-MOS fin 600 and second n-MOS fin 606 can be higher than the first p-MOS fin 602 and second p-MOS fin 604. In one embodiment, the first n-MOS fin 600 and second n-MOS fin 606 are higher than the first p-MOS fin 602 and second p-MOS fin 604 by about 1 nm or more and about 40 nm or less. In another embodiment, the first n-MOS fin 600 and second n-MOS fin 606 are higher than the first p-MOS fin 602 and second p-MOS fin 604 by about 5 nm or more and about 30 nm or less. In yet another embodiment, the first n-MOS fin 600 and second n-MOS fin 606 are higher than the first p-MOS fin 602 and second p-MOS fin 604 by about 10 nm or more and about 25 nm or less. In still yet another embodiment, the first n-MOS fin 600 and second n-MOS fin 606 have a height of about 40 nm and the first p-MOS fin 602 and second p-MOS fin 604 have a height of about 20 nm.

Figure 7:
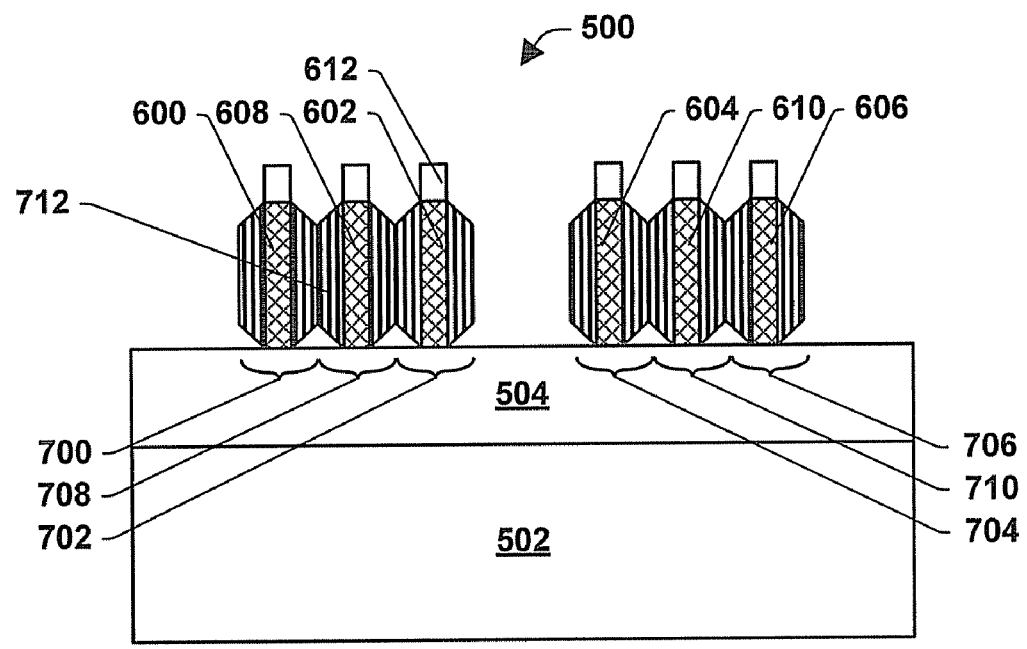

FIG. 7 illustrates widening a width of the assist-fins 608, 610. Some or all of the other transistor fins 600, 602, 604, 606 can be widened at the same time when widening the assist-fins 608, 610. When all of the fins are widened, four widened transistor fins 700, 702, 704, 706 and two widened assist-fins 708, 710 exist. In another embodiment, only assist-fins 608, 610 are widened and other fins 600, 602, 604, 606 are not widened (not shown).

The assist-fin 608, 610 can be widened by any suitable technique. For example, when the assist-fin contains silicon, the assist-fin is widened by a silicon epitaxial process, silicidation process, or combinations thereof. In this example, the assist-fin is widened by a silicon epitaxial process to form epitaxial silicon 712 on the surface of the assist-fin in FIG. 7, and then metal silicides are formed on the surface of the epitaxial silicon to electrically connect the fins in FIG. 8. Although not shown in Figures, the assist-fin can be widened only by a silicidation process to form metal silicides on the surface of the assist-fin so that the assist-fin electrically connects with adjacent fins.

By the silicon epitaxial process, silicon epitaxial layers 712 are formed on the surface of the assist-fins (e.g., side surfaces of the assist-fins). The silicon epitaxial growth can proceed under any suitable condition, for example, at elevated temperatures (e.g., 1,100 degrees Celsius using $SiCl_4$ as a source gas and $H_2$ as a carrier gas). The silicon epitaxial growth can be selectively formed on the side surface of the fin when a cap exists on the top of the fin. Although not shown, when a cap does not exist on the top of the fin, silicon epitaxial can be also formed on the top surface of the fin. The resultant widened assist-fin 708, 710 can contact with the adjacent fins 700, 702, 704, 706. In another embodiment, the widened assist-fin does not contact with the adjacent fins after a silicon epitaxial process (not shown), but the assist-fin can contact with the adjacent fins after a silicidation process which will be described in connection with FIG. 8.

Figure 8:
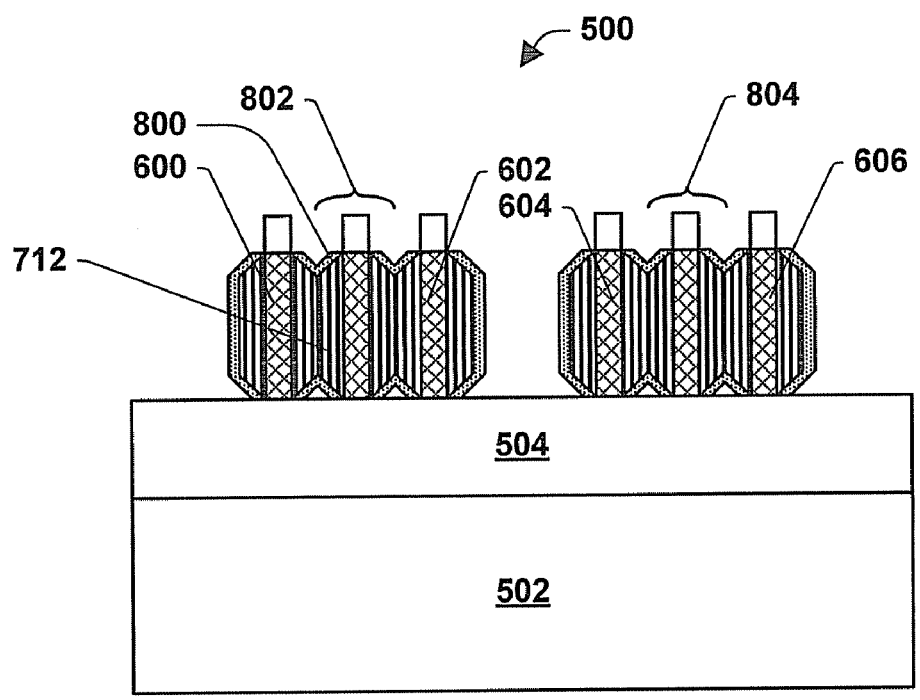

FIG. 8 illustrates forming metal-semiconductor compounds (e.g., metal silicides) 800 on the surfaces of the widened assist-fins 708, 710, thereby forming assist-bars 802, 804. The metal-semiconductor compounds can be also formed on the surfaces of the transistor fins 700, 702, 704, 706. Forming the metal-semiconductor compounds 800 on the assist-fins, the assist-bar 802, 804 electrically connects with the adjacent fins 700, 702, 704, 706 so that a portion of the fin of pull-up transistor is electrically connected to a portion of the fin of pull-down transistor via the assist-bar 802, 804.

By the silicidation process, metal silicides 800 are formed on the surfaces of the assist-fins 708, 710. The metal silicides 800 can be formed on the upper surfaces of the epitaxial silicon 712 of the assist-fins 708, 710 and/or the transistor fins 700, 702, 704, 706. The metal silicides can be formed by forming a metal layer (not shown) over the surfaces of the fins by spattering, for example, and heating the metal layer to cause a chemical reaction between the metal layer and the underlying silicon. During the silicidation process, the metal of the metal layer can diffuse into the underlying silicon and form the metal silicides 800. The metal silicides can be formed on the top surfaces of the fins when caps do not exist on the top surfaces of the fins (not shown).

Choice of suitable conditions and parameters of the silicidation process depends on, for example, the thickness of the resultant metal silicides, the configuration and/or constituent of the assist-fin, the desired implementations of the static random access memory cell structure being fabricated, and the like. For example, the metal silicides are formed by rapid thermal annealing (RTA).

The first assist-bar 802 can have any suitable width as long as one side surface of the assist-bar electrically connects with a portion of the first n-MOS fin 600 and the other side surface of the assist-bar electrically connects with a portion of the first p-MOS fin 602. The second assist-bar 804 can have any suitable width as long as one side surface of the assist-bar electrically connects with a portion of the second n-MOS fin 606 and the other side surface of the assist-bar electrically connects with a portion of the second p-MOS fin 604. When the fins 600, 602, 604, 606 of the transistors are widened in connection with FIG. 7, one side surface of the first assist-bar 802 electrically connects with a portion of the widened first n-MOS fin 700 and the other side surface of the first assist-bar 802 electrically connects with a portion of the widened first p-MOS fin 702. One side surface of the second assist-bar 804 electrically connects with a portion of the widened second n-MOS fin 706 and the other side surface of the second assist-bar 804 electrically connects with a portion of the widened second p-MOS fin 704.

A width of the widened portion of the assist-bar 802, 804 may vary and is not critical to the subject innovation. In one embodiment, the width is about 5 nm or more and about 30 nm or less. In another embodiment, the width is about 10 nm or more and about 20 nm or less. In yet another embodiment, the width is about 12 nm or more and about 18 nm or less. In still yet another embodiment, the width is about 15 nm. When the fins of transistors are widened at the same time when widening the assist-fin, the widened transistor fins 700, 702, 704, 706 can have the same width as the assist-bar 802, 804.

Figure 9:
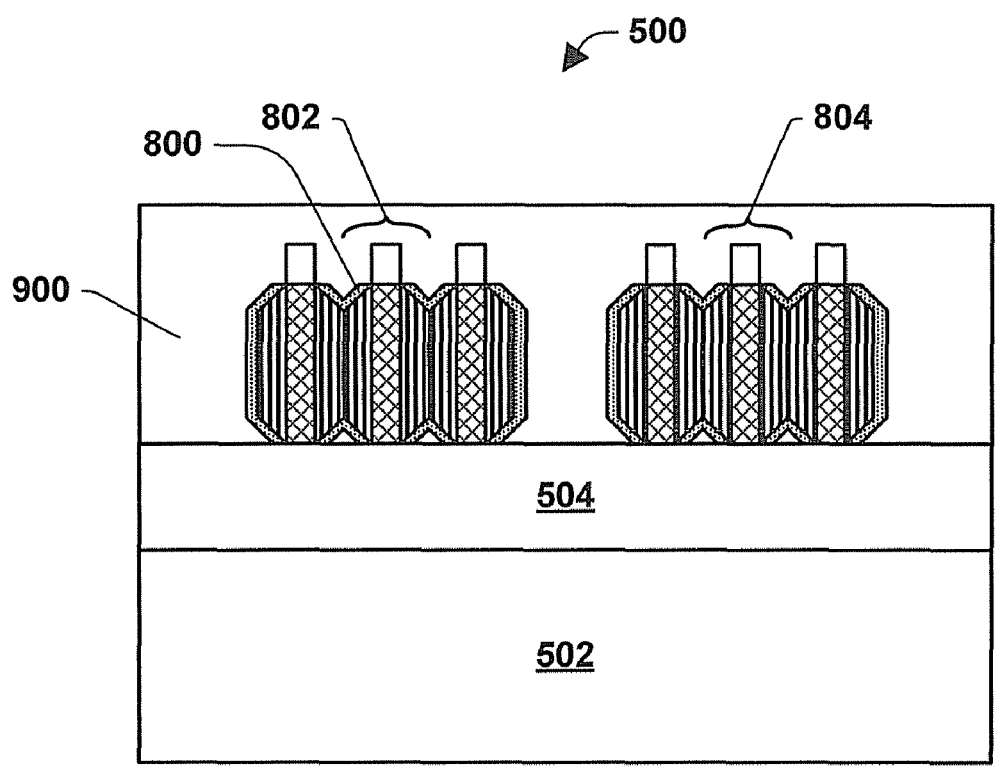

FIG. 9 illustrates forming an insulating layer 900 over the semiconductor substrate 502. The insulating layer 900 typically contains oxides such as silicon oxides or nitrides such as silicon nitrides. Although not shown in FIG. 9, contact holes, conductive lines, and other suitable components can be formed by any suitable memory device fabrication processes. General examples of memory device fabrication processes include masking, patterning, etching, planarization, thermal oxidation, implant, annealing, thermal treatment, and deposition techniques normally used for making memory devices.

Figure 10:
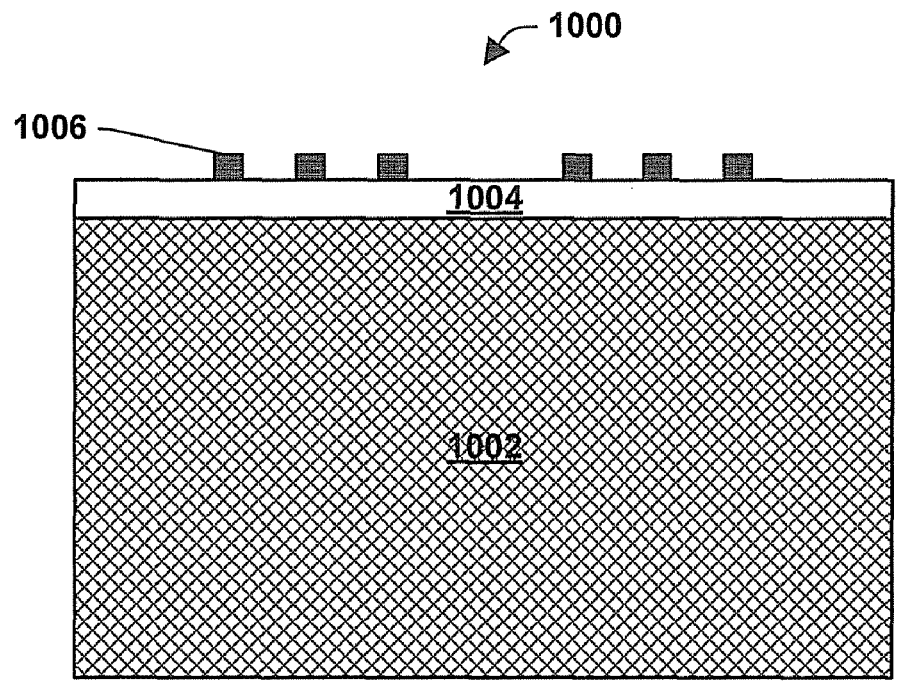
FIGS. 10-15 illustrate another exemplary methodology of forming a static random access memory cell in accordance with an aspect of the subject innovation.

FIGS. 10-15 illustrate another exemplary method of making a static random access memory cell. FIG. 10 illustrates a cross sectional view of an intermediate state of a portion of an exemplary static random access memory cell 1000. The static random access memory cell 1000 can contain a relatively thick semiconductor substrate (e.g., bulk semiconductor substrate) 1002, a cap layer 1004, and a patterned resist layer 1006.

Figure 11:
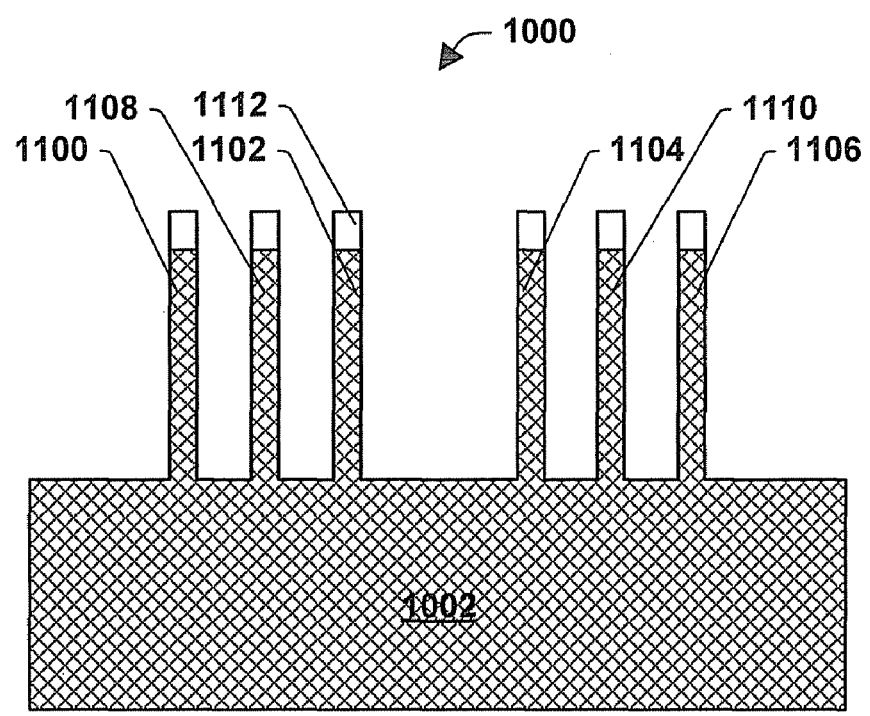

FIG. 11 illustrates forming six fins including four n- and p-MOS fins 1100, 1102, 1104, 1106 and two assist-fins 1108, 1110 from a portion of the semiconductor substrate 1102 and forming six caps 1112 on the fins from the cap layer 1004. A first assist-fin 1108 is located between a first n-MOS fin 1100 and a first p-MOS fin 1102. A second assist-fin 1110 is located between a second n-MOS fin 1106 and a second p-MOS fin 1104. The first n-MOS fin 1100 and second n-MOS fin 1106 can be portions of pass-gate transistors and pull-down transistors. The first p-MOS fin 1102 and second p-MOS fin 1104 can be a portion of pull-up transistors. Although the four n- and p-MOS fins 1100, 1102, 1104, 1106 are shown in FIG. 11, the static random access memory cell 1000 can contain any suitable number of fins depending on a type of transistors contained in the static random access memory cell. The fins 1100, 1102, 1104, 1106, 1108, 1110 and caps 1112 can be formed by any suitable technique. For example, the fins and caps are formed in the same manner as described in connection with FIG. 6.

Although not shown, in one embodiment, the static random access memory cell 1000 does not contain any caps on the fins. In another embodiment, the static random access memory cell contains caps on some of the fins. The cap layer or caps can be removed at the same time when forming the fins or after forming the fins.

Figure 12:
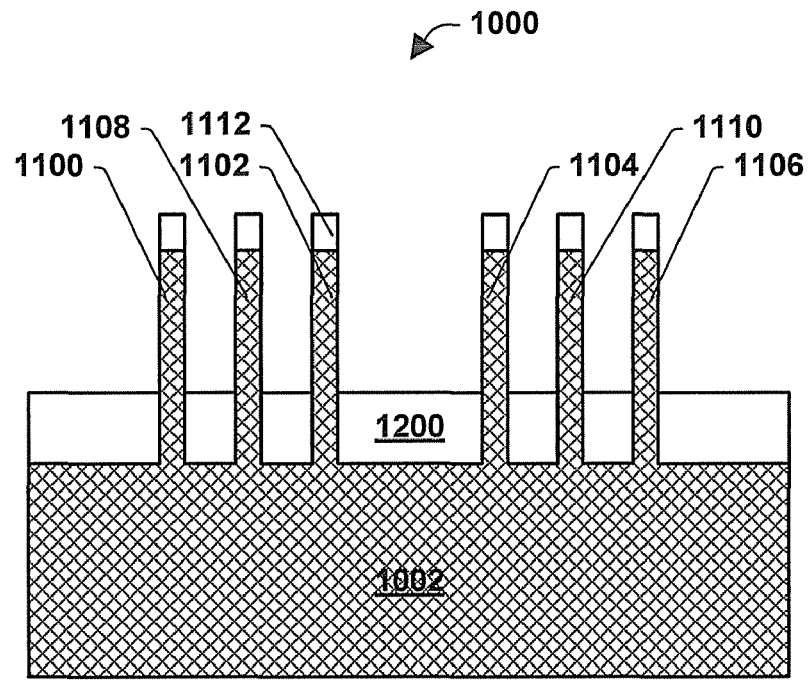

FIG. 12 illustrates forming a shallow trench isolation (e.g., STI) 1200 between the fins 1100, 1102, 1104, 1106, 1108, 1110 on the semiconductor substrate 1002. The STI 1200 can contain any suitable insulating material such as oxides (e.g., silicon oxides) and nitrides (e.g., silicon nitrides). The STI can be formed by any suitable technique. For example, an insulating layer (not shown) is formed over the semiconductor substrate 1202 and an upper portion of the insulating layer is removed, thereby leaving the STI 1200 between the fins.

The insulating layer can be formed by chemical vapor deposition (CVD) such as plasma enhanced chemical vapor deposition (PECVD), low-pressure chemical vapor deposition (LPCVD), high-pressure chemical vapor deposition (HPCVD), or the like. An upper portion of the insulating layer can be removed by chemical-mechanical polishing (CMP) and/or etching (e.g., reactive ion (RI) etching). For example, an upper portion of the insulating layer is polished by CMP down to the upper surface of the cap when the caps exist on the fins or down to the upper surface of the fins when caps do not exist, and then an upper portion of the insulating layer is further removed by RI etching. If a cap exists on the fin, the cap can be removed at the same time when the upper portion of the insulating layer is removed (not shown).

The height of the fin 1100, 1102, 1104, 1106, 1108, 1110 from the upper surface of the STI 1200 may vary and are not critical to the subject innovation. All of the fins have the same height, or some of or all of the fins have a different height from each other. In one embodiment, the height of the fin from the upper surface of the STI is about 5 nm or more and about 80 nm or less. In another embodiment, the height of the fin from the upper surface of the STI is about 10 nm or more and about 70 nm or less. In yet another embodiment, the height of the fin from the upper surface of the STI is about 15 nm or more and about 60 nm or less.

Figure 13:
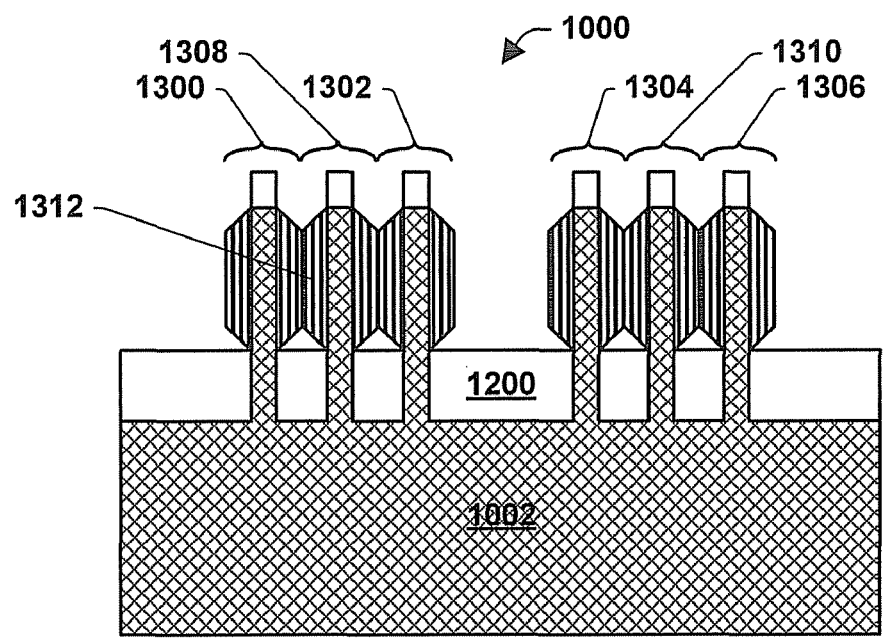

FIG. 13 illustrate widening a width of the assist-fins 1108, 1110. Some or all of the other transistor fins 1100, 1102, 1104, 1106 are widened at the same time when widening the assist-fin. When all of the fins are widened, four widened transistor fins 1300, 1302, 1304, 1306 and two widened assist-fins 1308, 1310 are formed. In another embodiment, only assist-fins are widened, and other fins are not widened (not shown). The assist-fin 1108, 1110 can be widened by any suitable technique, for example, in the same manner as described in connection with FIG. 7. In one embodiment, when the assist-fin 1108, 1110 contains silicon, the assist-fin is widened by a silicon epitaxial process, silicidation process, or combinations thereof. In this example, the assist-fin is widened by a silicon epitaxial process to form epitaxial silicon 1312 on the surface of the assist-fin.

Figure 14:
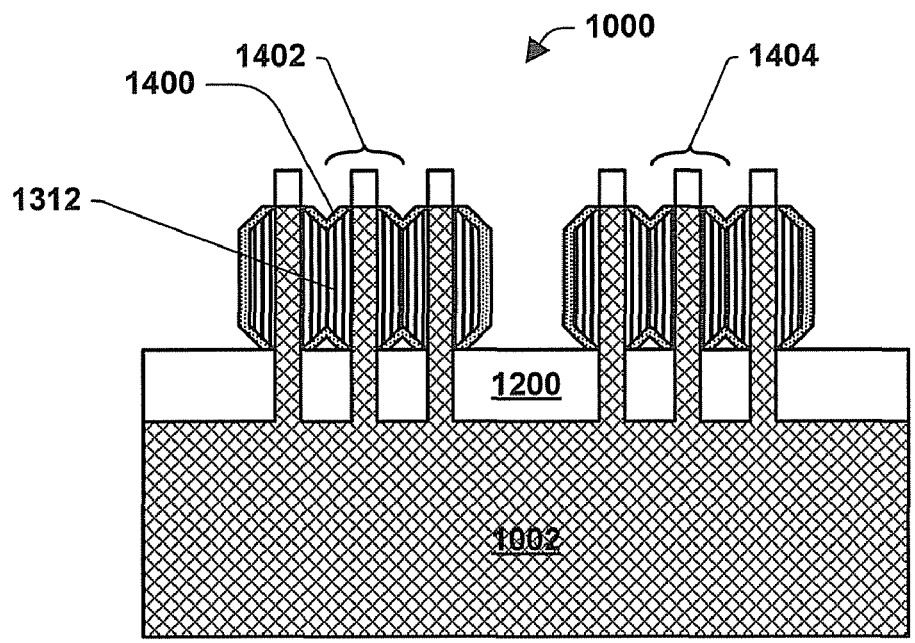

FIG. 14 illustrates forming metal-semiconductor compounds (e.g., metal silicides) 1400 on the widened assist-fin surface 1108, 1110, thereby forming assist-bars 1402, 1404. As a result, one side surface of the first assist-bar 1402 electrically connects to a portion of the first n-MOS fin 1100, 1300 and the other side surface of the first assist-bar 1402 electrically connects with a portion of the first p-MOS fin 1102, 1302. One side surface of the second assist-bar 1404 electrically connects to a portion of the second n-MOS fin 1106, 1306 and the other side surface of the second assist-bar 1404 electrically connects to a portion of the second p-MOS fin 1104, 1304. The metal-semiconductor compounds can be formed by any suitable technique, for example, in the same manner as described in connection with FIG. 8.

Figure 15:
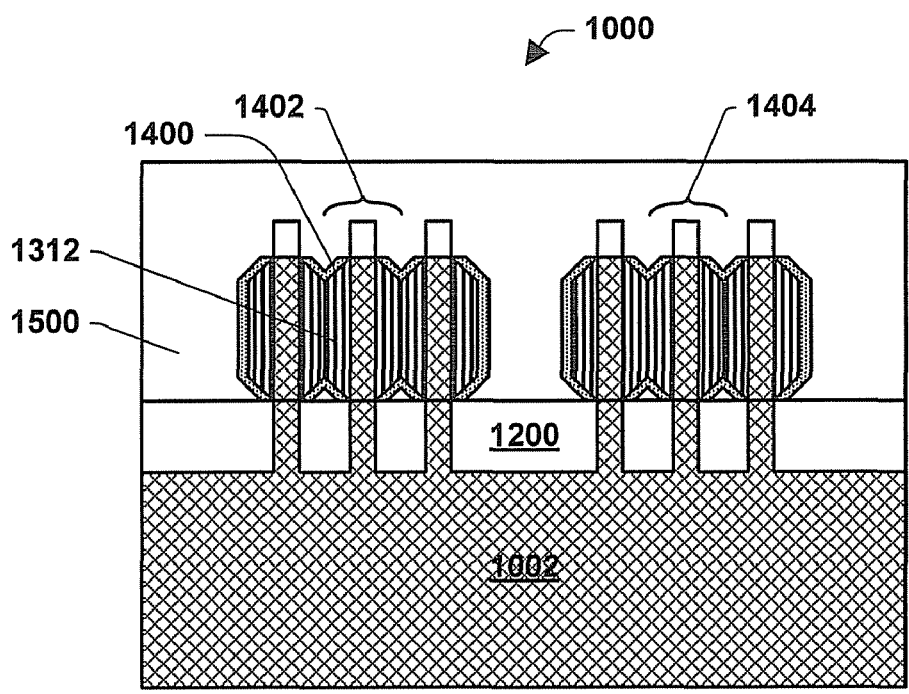

FIG. 15 illustrates forming an insulating layer 1500 over the semiconductor substrate 1002. The insulating layer 1500 typically contains oxides such as silicon oxides and nitrides such as silicon nitrides. Although not shown in FIG. 15, contact holes, conductive lines, and other suitable components can be faulted by any suitable memory device fabrication processes. General examples of memory device fabrication processes include masking, patterning, etching, planarization, thermal oxidation, implant, annealing, thermal treatment, and deposition techniques normally used for making memory devices.

The assist-bar described herein can be applied to any suitable random logic circuit containing two or more non-planar transistors (e.g., combinational random logic circuits). Examples of random logic circuits include an inverter, NOR, NAND, AND, or the like. The assist-bar electrically connects a portion of fin of one non-planar transistor and a portion of fin of another non-planar transistor of the random logic circuit. Containing the assist-bar, the random logic circuit does not need to contain a contact hole that is used to connect the portion of fin of one non-planar transistor and the portion of fin of another non-planar transistor. Therefore, the size/area of the random logic circuit can be reduced.

Figure 16:
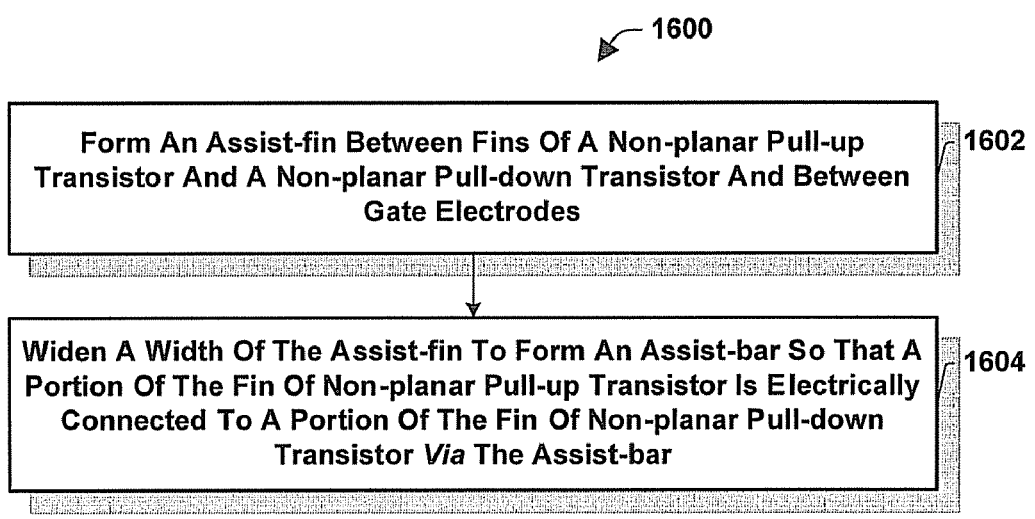
FIG. 16 is a flow diagram of an exemplary methodology of forming a static random access memory cell in accordance with an aspect of the subject innovation.

FIG. 16 illustrates an exemplary methodology 1600 of forming a static random access memory cell. At 1602, an assist-fin is formed between fins of a non-planar pull-up transistor and a non-planar pull-down transistor and between gate electrodes on a semiconductor substrate. At 1604, the assist-fin is widened to form an assist-bar so that a portion of the fin of non-planar pull-up transistor is electrically connected to a portion of the fin of non-planar pull-down transistor via the assist-bar.

Although not shown in FIG. 16, the assist-fin can be formed by a sidewall image transfer technique. In one embodiment, the assist-fin is widened by silicon epitaxial process, silicidation process, or combinations thereof. In another embodiment, the assist-fin is widened by silicon epitaxial process and then silicidation process. In yet another embodiment, a portion of the fin of the non-planar pull-up transistor and a portion of the fin of the non-planar pull-down transistor are widened at the same time when widening the assist-fin.

The methodology of FIG. 16 can be applied to any suitable random logic circuit containing two or more non-planar transistors. A random logic circuit can be made by forming an assist-fin between fins of non-planar transistors on a semiconductor substrate of the random logic circuit and widening a width of the assist-fin to form an assist-bar so that a portion of the fin of one non-planar transistor is electrically connected to a portion of the fin of another non-planar transistor via the assist-bar. The assist-bar is formed substantially vertically to the surface of the semiconductor substrate in a direction substantially parallel to the surface of the semiconductor substrate and parallel to the fins of the transistors.

An area of the random logic circuit can be reduced by electrically connecting the portion of fin of one non-planar transistor and the portion of fin of another non-planar transistor by the assist-bar. The area of the random logic circuit is reduced because the random logic circuit does not need to contain a contact hole and a conductive line that electrically connect the fins of non-planar transistors.

Figure 17:
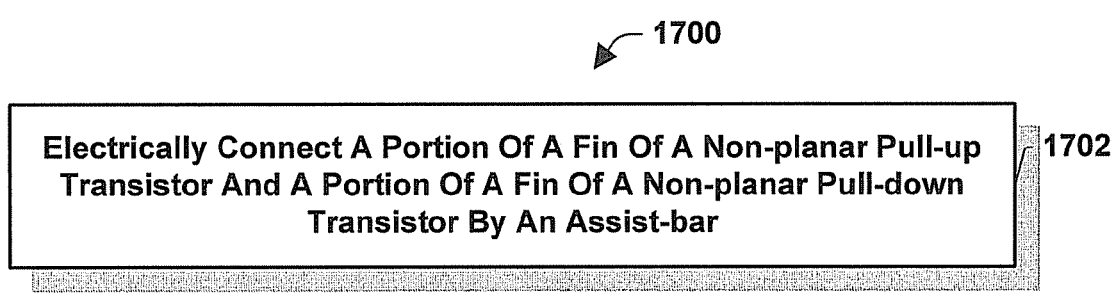
FIG. 17 is a flow diagram of an exemplary methodology of decreasing a cell area of a static random access memory cell in accordance with an aspect of the subject innovation.

FIG. 17 illustrates an exemplary methodology 1700 of decreasing a cell area of a static random access memory cell containing two non-planar pass-gate transistors, two non-planar pull-up transistors, and two non-planar pull-down transistors. At 1702, a portion of a fin of the non-planar pull-up transistor is electrically connected with a portion of a fin of the non-planar pull-down transistor by an assist-bar.

Although not shown in FIG. 17, the method does not involve electrically connecting the fin of the non-planar pull-up transistor and the fin of the non-planar pull-down transistor by a contact hole and a conductive line. In one embodiment, the portion of the fin of the non-planar pull-up transistor is connected to the portion of the fin of the non-planar pull-down transistor by forming an assist-fin between the fins of the non-planar pull-up transistor and the non-planar pull-down transistor and between gate electrodes, and widening a width of the assist-fin to form the assist-bar so that the portion of the fin of non-planar pull-up transistor is electrically connected to the portion of the fin of non-planar pull-down transistor via the assist-bar. The assist-fin does not intersect with gate electrodes (e.g., the assist-fin is formed between the gate electrodes).

In another embodiment, the assist-fin is widened by silicon epitaxial process, silicidation process, or combinations thereof. In yet another embodiment, the assist-bar electrically connects diffusion layers of the pass-gate transistor, the pull-down transistor, and the pull-up transistor. In still yet another embodiment, the assist-bar facilitates electrically connecting a diffusion layer of a pass-gate transistor, a drain of a pull-down transistor, and a drain of a pull-up transistor.

The methodology of FIG. 17 can be applied to any suitable random logic circuit containing two or more non-planar transistors. An area of a random logic circuit can be reduced by electrically connecting a portion of a fin of one non-planar transistor and a portion of a fin of another non-planar transistor by an assist-bar.

What has been described above includes examples of the disclosed innovation. It is, of course, not possible to describe every conceivable combination of components or methodologies for purposes of describing the disclosed innovation, but one of ordinary skill in the art can recognize that many further combinations and permutations of the disclosed innovation are possible. Accordingly, the disclosed innovation is intended to embrace all such alterations, modifications and variations that fall within the spirit and scope of the appended claims. Furthermore, to the extent that the term "contain," "includes," "has," "involve," or variants thereof is used in either the detailed description or the claims, such term can be inclusive in a manner similar to the term "comprising" as "comprising" is interpreted when employed as a transitional word in a claim.

What is claimed is:
1. A static random access memory cell, comprising:
two non-planar pass-gate transistors on a semiconductor substrate, each of the two non-planar pass-gate transistors comprising one or more non-planar pass-gate fins;
two non-planar pull-up transistors on the semiconductor substrate, each of the two non-planar pull-up transistors comprising one or more non-planar pull-up transistor fins;
two non-planar pull-down transistors on the semiconductor substrate, each of the two non-planar pull-down transistors comprising one or more non-planar pull-down transistor fins; and
two assist-bars on the semiconductor substrate, each of the two assist bars comprising one or more assist-bar fins extending parallel to the one or more non-planar pass gate fins of at least one of the two non-planar pass-gate transistors, the one or more non-planar pull-up transistor fins of at least one of the two non-planar pull-up transistors and the one or more non-planar pull down transistor fins of at least one of the two non-planar pull-down transistors and the two assist-bars electrically connecting a portion of the one or more fins of at least one of the two non-planar pull-up transistors and a portion of the one or more fins of at least one of the two non-planar pull-down transistors, wherein the two assist-bars are provided in a same layer level as the one or more non-planar pull-up transistor fins and the one or more non-planar pull-down transistor fins.

2. The static random access memory cell of claim 1, wherein the two assist-bars are formed substantially vertically to the surface of the semiconductor substrate and the one or more pull-down transistor fins of at least one of the two or more pull-down transistors and the one or more pull-up transistor fins of at least one of the two or more pull-up transistors.

3. The static random access memory cell of claim 1, wherein the two assist-bars comprise a semiconductor material and metal-semiconductor compound.

4. The static random access memory cell of claim 1, wherein the static random access memory cell does not comprise at least one of a contact hole and a conductive line that electrically connect the at least one non-planar pull-up transistor fin and the at least one non-planar pull-down transistor.

5. The static random access memory cell of claim 1, wherein the two non-planar pull-down transistors are N-typed FinMOSFETs and the two non-planar pull-up transistors are P-typed FinMOSFETs.

6. The static random access memory cell of claim 5, wherein the one or more non-planar pull-down transistor fins and the two non-planar pass-gate transistors have two types of contact holes: a first contact hole type comprising at least one contact hole that electrically connects a bitline to a n-diffusion layer and a second contact hole type comprising at least one contact hole that electrically connects the n-diffusion layer to a ground line.

7. The static random access memory cell of claim 1, wherein the two assist-bars facilitate electrically connecting diffusion layers of the two non-planar pass-gate transistors, the two non-planar pull-down transistors, and the two non-planar pull-up transistors.

8. The static random access memory cell of claim 5, wherein the static random access memory cell comprises ten contact holes, one contact hole on respective two gate electrodes, two contact holes on the respective two N-typed FinMOSFETs, and two contact holes on the respective two P-typed FinMOSFETs.

9. A random logic circuit; comprising:
a first non-planar transistor on a semiconductor substrate comprising a first fin;
a second non-planar transistor on the semiconductor substrate comprising a second fin; and one or more assist-bars on the semiconductor substrate, the one or more assist-bars electrically connecting a portion of the first fin and a portion of the second fin and the one or more assist-bars comprise one or more assist-bar fins that are parallel to the first fin and the second fin, wherein the one or more assist bars, the first fin and the second fin are provided in a same layer level.

* * * * *